(12) United States Patent
Nagai et al.

(10) Patent No.: US 7,549,560 B2
(45) Date of Patent: Jun. 23, 2009

(54) WAFER DIVIDING METHOD

(75) Inventors: Yusuke Nagai, Tokyo (JP); Toshiyuki Tateishi, Tokyo (JP); Tadato Nagasawa, Tokyo (JP)

(73) Assignee: Disco Corporation, Tokyo (JP)

( * ) Notice: Subject to any disclaimer, the term of this patent is extended or adjusted under 35 U.S.C. 154(b) by 492 days.

(21) Appl. No.: 11/128,197

(22) Filed: May 13, 2005

(65) Prior Publication Data

US 2005/0259459 A1 Nov. 24, 2005

(30) Foreign Application Priority Data

May 18, 2004 (JP) ............................. 2004-147193

(51) Int. Cl.
*B26F 3/00* (2006.01)
*H01L 21/66* (2006.01)
*H01L 21/20* (2006.01)
*B23K 26/38* (2006.01)

(52) U.S. Cl. ............................. 225/2; 438/15; 438/113; 438/460; 438/463; 219/121.67; 219/121.72

(58) Field of Classification Search ................. 438/460, 438/462, 463, 113, 464, 15, 33, 111, 68, 438/114, 120, 458, 465; 365/63; 125/35, 125/12; 296/56; 257/620, 698; 451/41, 451/55; 219/121.172, 121.76, 121.77, 121.67, 219/121.84, 121.8; 156/349; 225/2
See application file for complete search history.

(56) References Cited

U.S. PATENT DOCUMENTS

| | | | | |
|---|---|---|---|---|
| 4,775,085 | A * | 10/1988 | Ishizuka et al. | ............. 225/105 |
| 7,141,443 | B2 * | 11/2006 | Nagai et al. | ................... 438/33 |
| 2002/0025587 | A1 * | 2/2002 | Wada | ........................... 438/15 |
| 2003/0155333 | A1 * | 8/2003 | Ye et al. | ................ 219/121.67 |
| 2003/0162367 | A1 * | 8/2003 | Roche | ......................... 438/460 |
| 2005/0023260 | A1 * | 2/2005 | Takyu et al. | ............ 219/121.67 |
| 2005/0181581 | A1 * | 8/2005 | Fukuyo et al. | .............. 438/463 |
| 2006/0035411 | A1 * | 2/2006 | Oba et al. | .................... 438/113 |
| 2006/0040473 | A1 * | 2/2006 | Fukuyo et al. | .............. 438/463 |
| 2006/0121697 | A1 * | 6/2006 | Fujii et al. | ................... 438/460 |
| 2007/0287267 | A1 * | 12/2007 | Sakamoto et al. | ........... 438/463 |
| 2008/0203538 | A1 * | 8/2008 | Kumakawa et al. | ......... 257/620 |

(Continued)

FOREIGN PATENT DOCUMENTS

JP 2002-192370 7/2002

(Continued)

*Primary Examiner*—Ghassem Alie
(74) *Attorney, Agent, or Firm*—Smith, Gambrell & Russell, LLP

(57) ABSTRACT

A method of dividing a wafer along a plurality of first dividing lines and a plurality of second dividing lines intersecting with the first dividing lines on the surface of the wafer. The method includes an internal deteriorated layer forming step for forming a deteriorated layer in the inside of the wafer along both the first dividing lines and the second dividing lines by applying a laser beam along the first dividing lines and the second dividing lines. It also includes an intersection deteriorated layer forming step for forming a deteriorated layer thicker than the deteriorated layer formed in the internal deteriorated layer forming step by applying a laser beam to intersection areas between the first and second dividing lines. Thereafter, a dividing step divides the wafer into individual chips along the first and second dividing lines by exertion of external force to the wafer.

2 Claims, 8 Drawing Sheets

U.S. PATENT DOCUMENTS

2009/0026185 A1* 1/2009 Sakamoto ............. 219/121.72
2009/0032509 A1* 2/2009 Kuno et al. ............ 219/121.72

FOREIGN PATENT DOCUMENTS

| JP | 3408805 | 3/2003 |
| JP | 2004-001076 | 1/2004 |
| JP | 2004-343008 | 12/2004 |
| JP | 2002192370 * | 7/2007 |

* cited by examiner (a)

(b)

WAFER DIVIDING METHOD

FIELD OF THE INVENTION

The present invention relates to a method of dividing, along the dividing lines, a wafer having function elements in areas sectioned by dividing lines formed in a lattice pattern on the surface.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit (function element) such as IC, LSI or the like is formed in each of the sectioned areas. Individual semiconductor chips are manufactured by cutting the semiconductor wafer along the dividing lines to divide it into the areas having a circuit formed thereon. An optical device wafer comprising light receiving elements (function elements) such as photodiodes or light-emitting elements (function elements) such as laser diodes, which are laminated on the front surface of a sapphire substrate is also cut along dividing lines to be divided into individual optical devices such as photodiodes or laser diodes, and these optical devices are widely used in electric equipment.

Cutting along the dividing lines of the above semiconductor wafer or optical device wafer is generally carried out by using a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means comprises a spindle unit that comprises a rotary spindle, a cutting blade mounted on the spindle and a drive unit for rotary-driving the rotary spindle. The cutting blade is composed of a disk-like base and an annular edge that is mounted on the side wall peripheral portion of the base and is formed as thick as about 20 μm by fixing diamond abrasive grains having a diameter of about 3 μm to the base by electroforming.

Since the cutting blade has a thickness of about 20 μm, however, the dividing lines for sectioning chips must have a width of about 50 μm and consequently, the area ratio of the dividing lines to the wafer is large, thereby reducing productivity. Further, since a sapphire substrate, silicon carbide substrate, and the like have high Mohs hardness, cutting with the above cutting blade is not always easy.

Meanwhile, as a means of dividing a plate-like workpiece such as a semiconductor wafer, a laser processing method for applying a pulse laser beam capable of passing through the workpiece with its focusing point set to the inside of the area to be divided is also attempted nowadays. In the dividing method making use of this laser processing technique, the workpiece is divided by applying a pulse laser beam having an infrared range capable of passing through the workpiece with its focusing point set to the inside, from one surface side of the workpiece to continuously form a deteriorated layer along the dividing lines in the inside of the workpiece and by exerting external force along the dividing lines whose strength has been reduced by the formation of the deteriorated layers. This method is disclosed by Japanese Patent No. 3408805.

However, the above method involves problems that relatively large external force must be applied to break the semiconductor wafer along the dividing lines in which the deteriorated layer has been formed in the inside, and that the semiconductor wafer is not always divided along the dividing lines by applying external force, whereby a chip may sustain damage.

To solve the above problems, the applicant proposes as JP-A 2004-343008 a technology capable of dividing a wafer along deteriorated layers without fail by forming the deteriorated layers exposed to at least one surface of the wafer.

There arises a new problem, however, that the deteriorated layer exposed to one surface remains on the side surface of the obtained chip to reduce the transverse rupture strength of the chip.

SUMMARY OF THE INVENTION

It is an object of the present invention to provide a method of dividing a wafer along dividing lines by applying a pulse laser beam along the dividing lines of a wafer to form deteriorated layers and then, divide the wafer along the dividing lines having the deteriorated layer formed therein, the method being capable of dividing the wafer easily without reducing its transverse rupture strength.

According to the present invention, the above object of the present invention is attained by a method of dividing a wafer having function elements formed in areas sectioned by a plurality of first dividing lines formed parallel to one another and a plurality of second dividing lines that intersect with the first dividing lines and are formed parallel to one another, on the front surface thereof, along the first dividing lines and the second dividing lines, comprising:

an internal deteriorated layer forming step for forming a deteriorated layer in the inside of the water along the first dividing lines and the second dividing lines by applying a pulse laser beam capable of passing through the wafer along the first dividing lines and the second dividing lines;

an intersection deteriorated layer forming step for forming a deteriorated layer thicker than the deteriorated layer formed in the internal deteriorated layer forming step by applying a pulse laser beam capable of passing through the wafer to intersection areas formed between the first dividing lines and the second dividing lines; and a dividing step for dividing the wafer into individual chips along the first dividing lines and the second dividing lines by exerting external force to the wafer having the deteriorated layers formed along the first dividing lines and the second dividing lines.

Desirably, the total thickness of the deteriorated layer formed at the above intersection area in the intersection deteriorated layer forming step and the internal deteriorated layer forming step is to be 60% or more of the thickness of the wafer, and the length of the deteriorated layer is to be 10 to 30% of the interval of the first dividing lines and the interval of the second dividing lines.

The above dividing step is to divide the wafer into individual chips along the first dividing lines and the second dividing lines by expanding an extensible support tape affixed to the wafer that has been subjected to the internal deteriorated layer forming step and the intersection deteriorated layer forming step.

According to the method of dividing a wafer of the present invention, a deteriorated layer is formed along the first dividing lines and the second dividing lines in the inside of the wafer in the internal deteriorated layer forming step, and a deteriorated layer thicker than the deteriorated layer formed in the internal deteriorated layer forming step is formed in intersection areas between the first dividing lines and the second dividing lines in the intersection deteriorated layer forming step. Therefore, the deteriorated layers formed in the above intersection areas are first fractured by exerting external force, and this fracture works as a starting point and spreads to the deteriorated layers formed in the internal deteriorated layer forming step, thereby making it possible to easily divide the wafer along the first dividing lines and the second dividing lines. Although the deteriorated layers remain on the side faces of the chips obtained by dividing along the first dividing lines and the second dividing lines, the deteriorated layers formed in the intersection deteriorated layer forming step are only in the both end portions in the longitudinal direction of the side faces and the deteriorated layers formed in the internal deteriorated layer forming step do not reach the front surface and the back surface. Therefore, the transverse rupture strengths of the obtained chips do not degrade.

DETAILED DESCRIPTION OF THE PREFERRED EMBODIMENTS

Preferred embodiments of the present invention will be described in detail with reference to the accompanying drawings.

Figure 1:
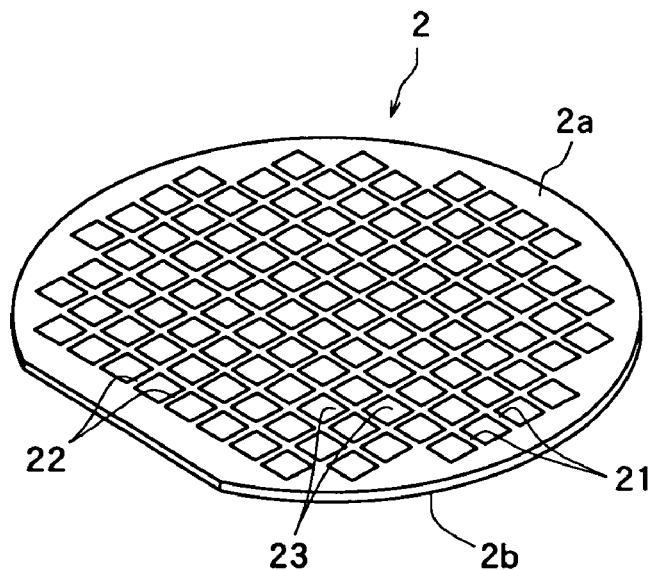
FIG. 1 is a perspective view of a semiconductor wafer to be divided by the wafer dividing method of the present invention.

FIG. 1 is a perspective view of a semiconductor wafer as a wafer to be processed according to the present invention. The semiconductor wafer 2 shown in FIG. 1 is formed of a silicon wafer having a thickness of 300 μm, and a circuit 23 as a function element is formed in each of a plurality of areas sectioned by a plurality of first dividing lines 21 formed parallel to one another and a plurality of second dividing lines 22 that intersect with the first dividing lines 21 at right angles and are formed parallel to one another, on the front surface 2a. A description is subsequently given of the method of dividing this semiconductor wafer 2 into individual semiconductor chips.

To divide the semiconductor wafer 2 into individual semiconductor chips, an internal deteriorated layer forming step for applying a pulse laser beam capable of passing through the wafer 2 along the first dividing lines 21 and the second dividing lines 22 to form a deteriorated layer in the inside of the wafer 2 along the first dividing lines 21 and the second dividing lines 22 and an intersection deteriorated layer forming step for forming a deteriorated layer thicker than the deteriorated layer formed in the above internal deteriorated layer forming step by applying a pulse laser beam capable of passing through the wafer 2 to the intersection areas between the first dividing lines 21 and the second dividing lines 22 are carried out. The internal deteriorated layer forming step and the intersection deteriorated layer forming step are carried out by using a laser beam processing machine 3 shown in FIGS. 2 to 4. The laser beam processing machine 3 shown in FIGS. 2 to 4 comprises a chuck table 31 for holding a workpiece, a laser beam application means 32 for applying a laser beam to the workpiece held on the chuck table 31 and an image pick-up means 33 for picking up an image of the workpiece held on the chuck table 31. The chuck table 31 is so constituted as to suction-hold the workpiece, and is designed to be moved in a processing-feed direction indicated by an arrow X and an indexing-feed direction indicated by an arrow Y in FIG. 2 by a moving mechanism that is not shown.

Figure 3:
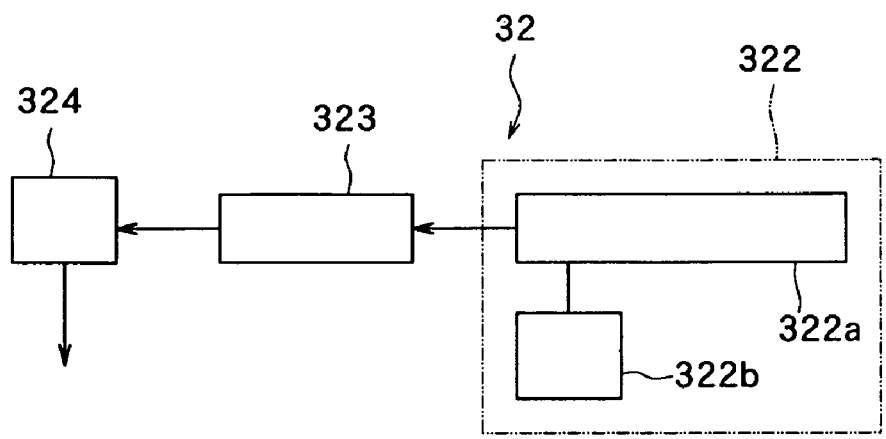
FIG. 3 is a block diagram showing the constitution of laser beam application means provided in the laser beam processing machine shown in FIG. 2.
Figure 4:
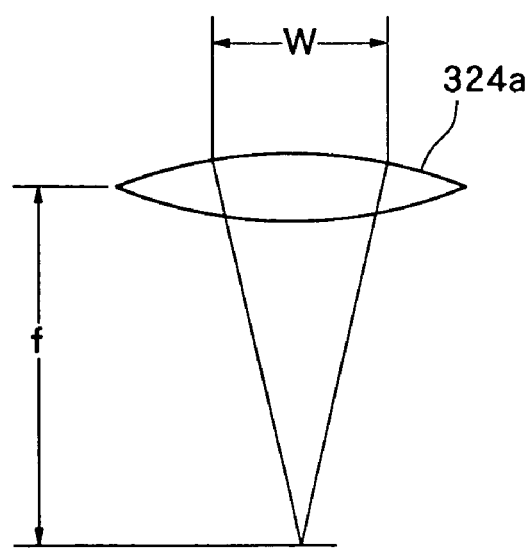
FIG. 4 is a schematic diagram for explaining the focusing spot diameter of a pulse laser beam.

The above laser beam application means 32 has a cylindrical casing 321 arranged substantially horizontally. In the casing 321, as shown in FIG. 3, a pulse laser beam oscillation means 322 and a transmission optical system 323 are installed. The pulse laser beam oscillation means 322 comprises a pulse laser beam oscillator 322a composed of a YAG laser oscillator or YVO4 laser oscillator and a repetition frequency setting means 322b connected to the pulse laser beam oscillator 322a. The transmission optical system 323 comprises suitable optical elements such as a beam splitter, etc. A condenser 324 housing condensing lenses (not shown) constituted by a set of lenses that may be known formation is attached to the end of the above casing 321. A laser beam oscillated from the above pulse laser beam oscillation means 322 reaches the condenser 324 through the transmission optical system 323 and is applied from the condenser 324 to the workpiece held on the above chuck table 31 at a predetermined focusing spot diameter D. This focusing spot diameter D is defined by the expression D (μm)=4×λ×f/(π×W) (wherein λ is the wavelength (μm) of the pulse laser beam, W is the diameter (mm) of the pulse laser beam applied to an objective lens 324a, and f is the focusing distance (mm) of the objective lens 324a) when the pulse laser beam showing a Gaussian distribution is applied through the objective lens 324a of the condenser 324 as shown in FIG. 4.

The image pick-up means 33 mounted to the end of the casing 321 constituting the above laser beam application means 32 is constituted by an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means that will be described later.

The above internal deteriorated layer forming step and the intersection deteriorated layer forming step, which are carried out by using the above laser beam processing machine 3 will be described with reference to FIG. 2 and FIGS. 5(a) to 5(c).

Figure 2:
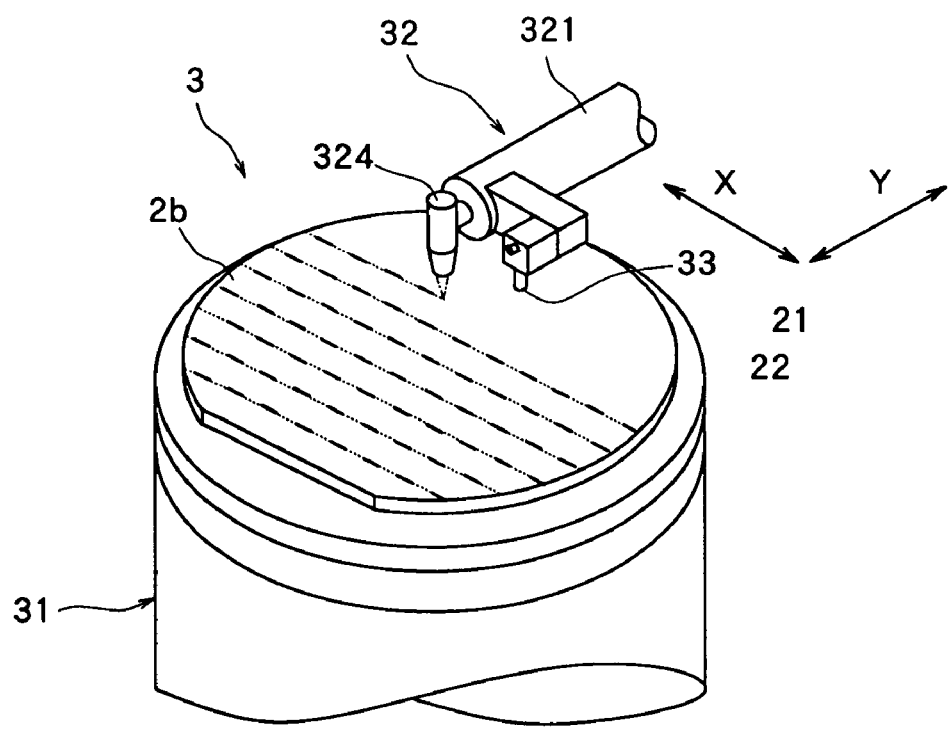
FIG. 2 is a perspective view of the principal section of a laser beam processing machine for carrying out an intersection deteriorated layer forming step and an internal deteriorated layer forming step in the wafer dividing method of the present invention.

In the internal deteriorated layer forming step and the intersection deteriorated layer forming step, the semiconductor wafer 2 is first placed on the chuck table 31 of the laser beam processing machine 3 shown in FIG. 2 in such a manner that the back surface 2b faces up and suction-held on the chuck table 31. The chuck table 31 suction-holding the semiconductor wafer 2 is positioned right below the image pick-up means 33 by a moving mechanism that is not shown.

After the chuck table 31 is positioned right below the image pick-up means 33, alignment work for detecting the area to be processed of the semiconductor wafer 2 is carried out by using the image pick-up means 33 and the control means that is not shown. That is, the image pick-up means 33 and the control means (not shown) carry out image processing such as pattern matching, etc., to align a first dividing line 21 formed in a predetermined direction of the semiconductor wafer 2 with the condenser 324 of the laser beam application means 32 for applying a laser beam along the first dividing line 21, thereby performing the alignment of a laser beam application position. The alignment of the laser beam application position is also similarly carried out on second dividing lines 22 that are formed on the semiconductor wafer 2 and extend in a direction perpendicular to the first dividing line 21 formed on the semiconductor wafer 2. Although the surface 10a on which the first dividing lines 21 and the second dividing lines 22 are formed, of the semiconductor wafer 2 faces down at this point, images of the first dividing lines 21 and the second dividing lines 22 can be taken through the back surface 2b as the image pick-up means 33 has an infrared illuminating means, an optical system for capturing infrared radiation and an image pick-up device (infrared CCD) for outputting an electric signal corresponding to the infrared radiation as described above.

Figure 5:
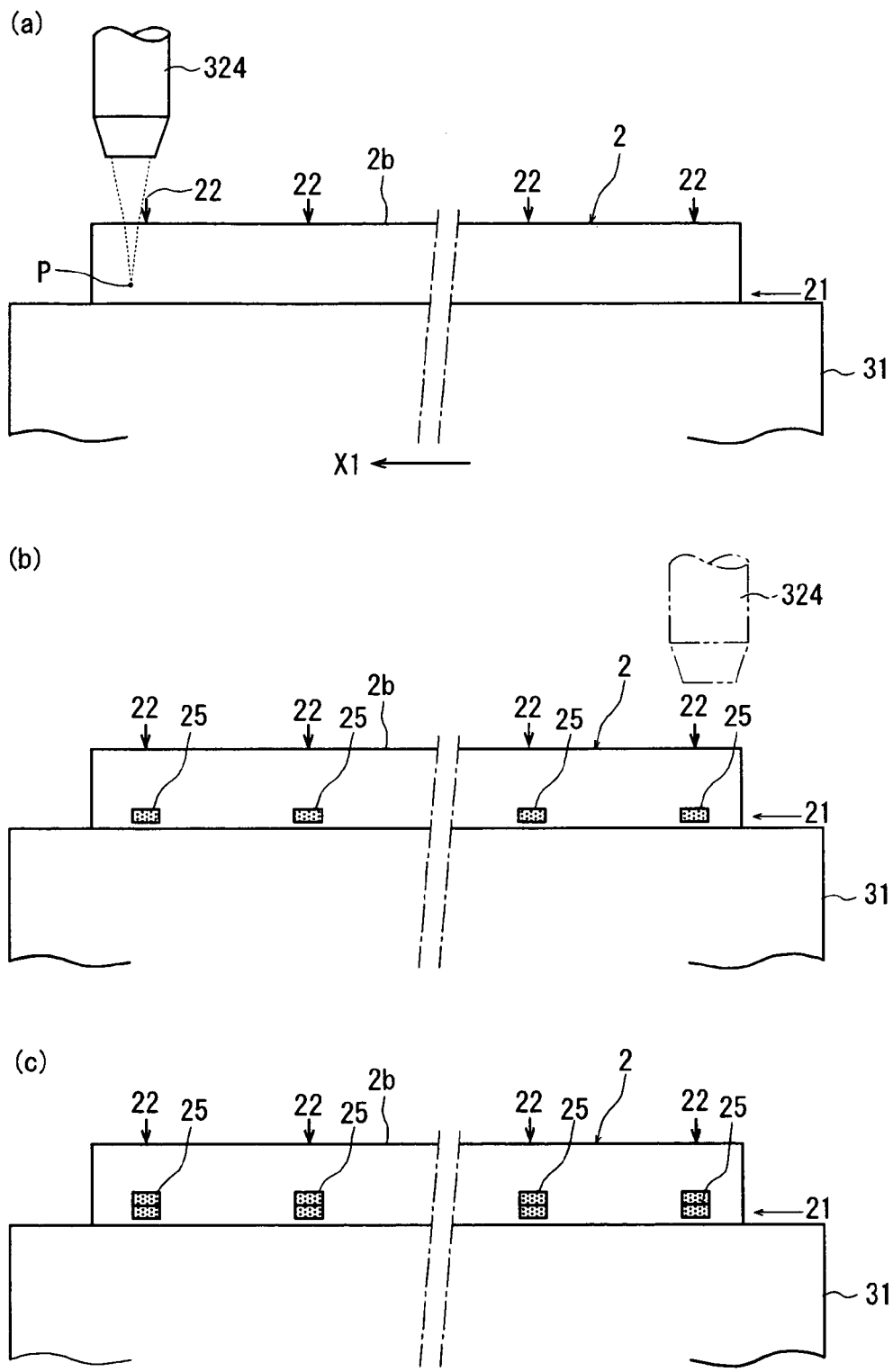
FIGS. 5(a) to 5(c) are explanatory diagrams of the intersection deteriorated layer forming step in the wafer dividing method of the present invention.

After the first dividing lines 21 and the second dividing lines 22 formed on the semiconductor wafer 2 held on the chuck table 31 are detected and the alignment of the laser beam application position is carried out as described above, the chuck table 31 is moved to a laser beam application area where the condenser 324 of the laser beam application means 32 for applying a laser beam is located, to bring the intersection point (i.e., position indicated by the arrow) between the predetermined first dividing line 21 and the second dividing line 22 on the most left side in FIG. 5(a) to a position right below the condenser 324 as shown in FIG. 5(a). The chuck table 31, that is, the semiconductor wafer 2 is moved in the direction indicated by the arrow X1 in FIG. 5(a) at a predetermined feed rate while a pulse laser beam capable of passing through the semiconductor wafer 2 is applied from the condenser 324. At this point, the focusing point P of the pulse laser beam is set to a position slightly above the surface 2a (undersurface) of the semiconductor wafer 2. When the chuck table 31, that is, the semiconductor wafer 2 is moved, for example, 1 mm, the application of the pulse laser beam is suspended. Meanwhile, the chuck table 31, that is, the semiconductor wafer 2 is moved in the direction indicated by the arrow X1 in FIG. 5(a) at the predetermined feed rate. When a position on the left side, for example, 1 mm away from the intersection point between the predetermined first dividing line 21 and the second dividing line 22 of the second group from the left in FIG. 5(a) reaches right below the condenser 324, a pulse laser beam capable of passing through the semiconductor wafer 2 is applied from the condenser 324 again and when the position on the right side, for example, 1 mm away from the above intersection point reaches right below the condenser 324, the application of the pulse laser beam is suspended. Thus, the laser beam is applied along the predetermined first dividing line 21 to the intersection areas between it and the second dividing lines 22 as described above. As a result, deteriorated layers 25 are each formed along the predetermined first dividing line 21 in the intersection areas between it and the second dividing lines 22 as shown in FIG. 5(b). This deteriorated layers 25 is formed as a molten-resolidified layer, of which the wafer has been once molten and then re-solidified.

The processing conditions in the above intersection deteriorated layer forming step are set as follows, for example.

Light source: LD excited Q switch Nd:YVO4 laser

Wavelength: pulse laser having a wavelength of 1,064 nm

Pulse output: 10 μJ

Focusing spot diameter: 1 μm

Repetition frequency: 100 kHz

Processing-feed rate: 100 mm/sec

Under the above processing conditions, the thickness of the deteriorated layer formed once is about 50 μm. In the illustrated embodiment, as shown in FIG. 5(c), another deteriorated layer 25 is formed on the upside of the deteriorated layer 25 formed as shown in FIG. 5(b). At this point, the above intersection deteriorated layer forming step is carried out by setting the focusing point P of the pulse laser beam applied from the condenser 324 to a position around the top surface of the deteriorated layer 25 formed as shown in FIG. 5(b).

Figure 6:
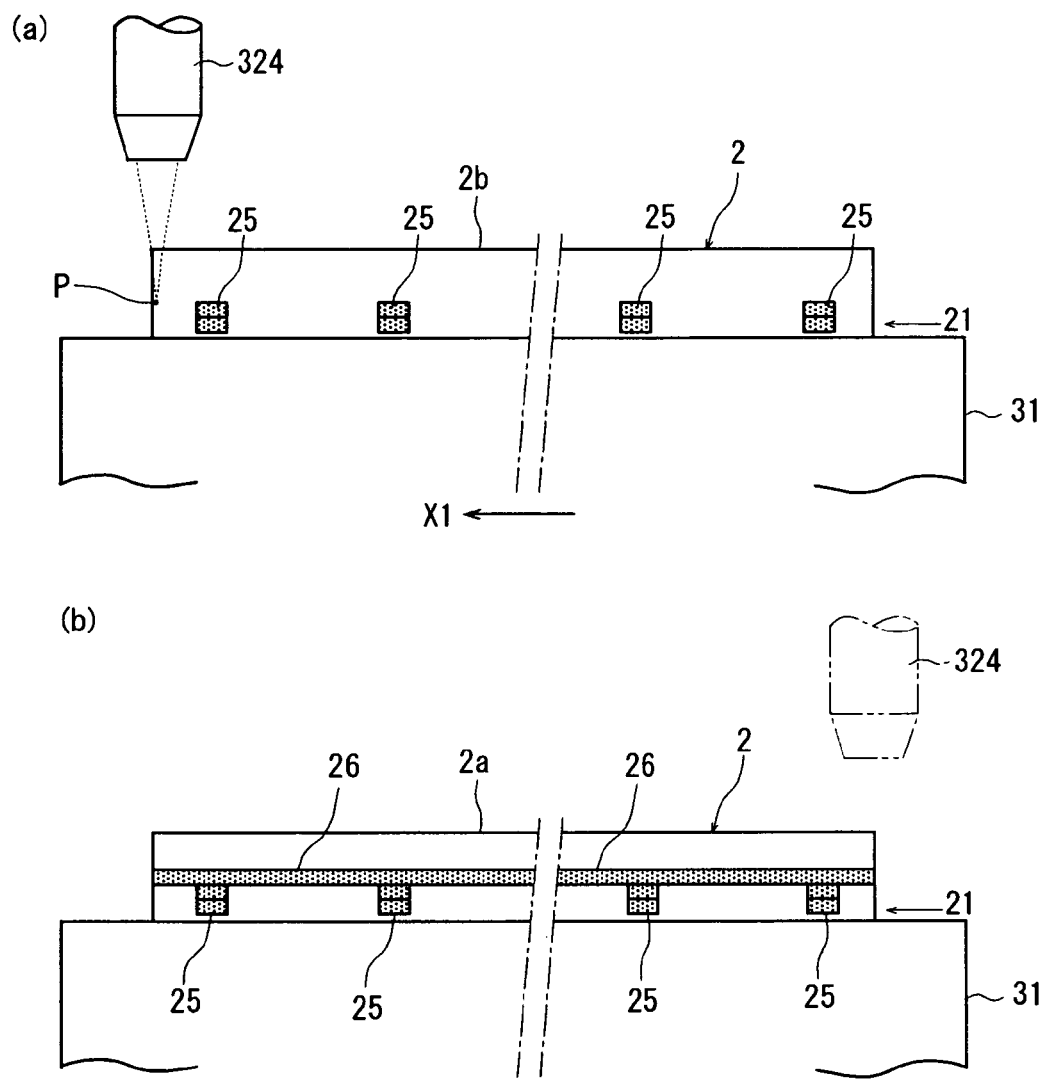
FIGS. 6(a) and 6(b) are explanatory diagrams of the internal deteriorated layer forming step in the wafer dividing method of the present invention.

After the two-layered deteriorated layers 25 are formed along the predetermined first dividing line 21 formed on the wafer 2 in the intersection areas between it and the second dividing lines 22, next comes the above internal deteriorated layer forming step. In this internal deteriorated layer forming step, as shown in FIG. 6(a), the chuck table 31 is moved to the laser beam application area where the condenser 324 of the laser beam application means 32 for applying a laser beam is located, to bring one end (left end in FIG. 6(a)) of the predetermined first dividing line 21 to a position right below the condenser 324. The chuck table 31, that is, the semiconductor wafer 2 is then moved in the direction indicated by the arrow X1 in FIG. 6(a) at a predetermined feed rate while a pulse laser beam capable of passing through the semiconductor wafer 2 is applied from the condenser 324. At this point, the focusing point P of the pulse laser beam is set to a position around the top surface of the second deteriorated layer 25 from the bottom. Then, when the application position of the condenser 324 reaches the other end of the first dividing line 21 as shown in FIG. 6(b), the application of the pulse laser beam is suspended and the movement of the chuck table 31, that is, the semiconductor wafer 2 is stopped. As a result, a continuous deteriorated layer 26 is formed along the first dividing line 21 in the center portion in the thickness direction in the inside of the semiconductor wafer 2. This deteriorated layer 26 is formed as a molten-resolidified layer, of which the wafer has been once molten and then re-solidified. The processing conditions in the internal deteriorated layer forming step maybe the same as those of the above intersection deteriorated layer forming step. Therefore, in the above embodiment, the continuous deteriorated layer 26 having a thickness of about 50 μm is formed in the inside of the semiconductor wafer 2.

Figure 7:
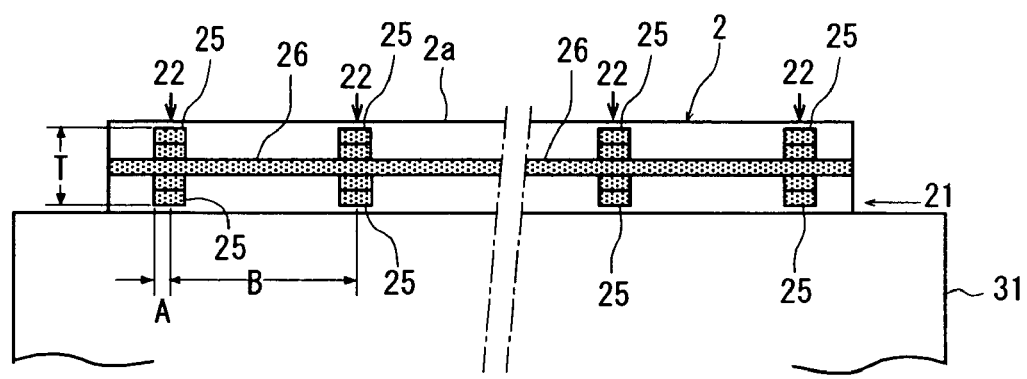
FIG. 7 is an explanatory diagram showing a state where the intersection deteriorated layer forming step and the internal deteriorated layer forming step have been carried out in the wafer dividing method of the present invention.

Next comes again the above intersection deteriorated layer forming step as shown in FIG. 7. In the illustrated embodiment, two-layered deteriorated layers 25 are formed on the upside of the above deteriorated layer 26. Consequently, in the illustrated embodiment, five-layered deteriorated layers are formed along the predetermined first dividing line 21 in the intersection areas between it and the second dividing lines 22. In a semiconductor wafer having a thickness of 300 μm, six deteriorated layers may be formed so that they extend from the front surface 2a to the back surface 2b. The total thickness T of the deteriorated layers 25 and 26 formed in the intersection areas is desirably 60% or more of the thickness of the semiconductor wafer 2. The length A from the intersection point (position indicated by the arrow) of each of the deteriorated layers 25 is desirably 5 to 15% of the interval B of the dividing lines, that is, the length of one side of the obtained chip. In the illustrated embodiment, the deteriorated layer 26 is formed in the center portion in the thickness direction of the semiconductor wafer 2, but the deteriorated layer 26 may be formed above or below the center portion in the thickness direction of the semiconductor wafer 2.

After the above intersection deteriorated layer forming step and the internal deteriorated layer forming step are carried out along the predetermined first dividing line 21 as described above, the chuck table 31, i.e., the semiconductor wafer 2 held on the chuck table 31 is moved in the indexing-feed direction indicated by the arrow Y by the interval between the first dividing lines 21 (indexing step), and then, the above intersection deteriorated layer forming step and the internal deteriorated layer forming step are carried out similarly. Thus, after the above intersection deteriorated layer forming step and the internal deteriorated layer forming step are carried out along all the first dividing lines 21 extending in the predetermined direction, the chuck table 31, i.e., the semiconductor wafer 2 held on the chuck table 31 is turned at 90° to carry out the above intersection deteriorated layer forming step and the internal deteriorated layer forming step along the second dividing lines 22 extending in a direction perpendicular to the above first dividing lines 21.

Although in the above embodiment, the above intersection deteriorated layer forming step and the internal deteriorated layer forming step are carried out in sequence from the lowermost layer to the upper layers, the internal deteriorated layer forming step may be carried out after the intersection deteriorated layer forming step, or the intersection deteriorated layer forming step may be carried out after the internal deteriorated layer forming step.

Figure 8:
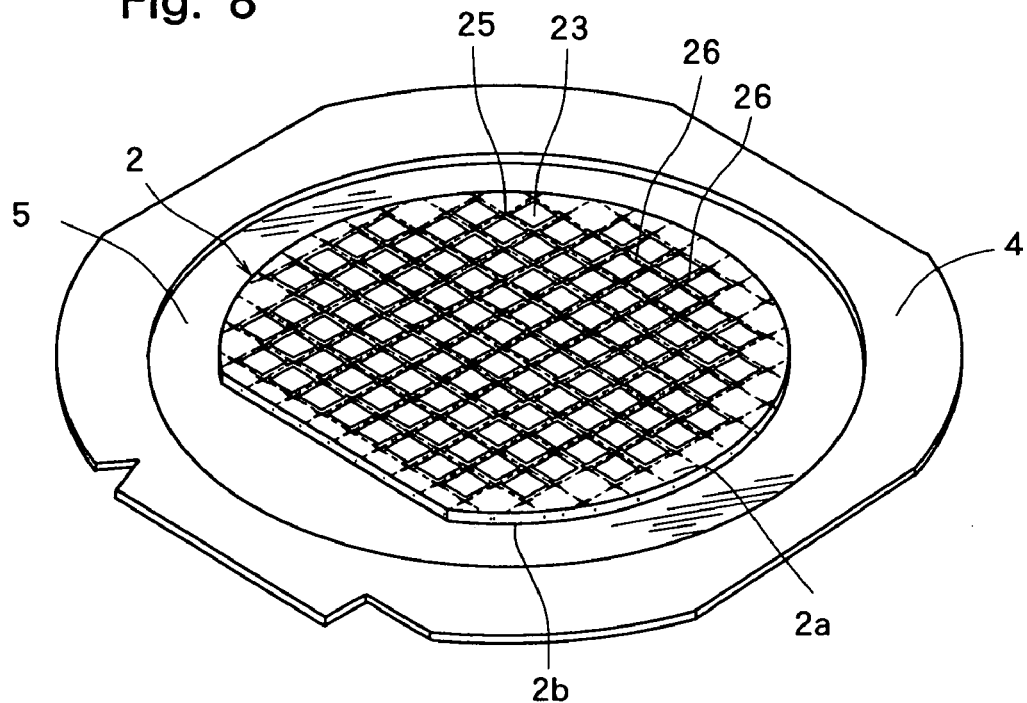
FIG. 8 is a perspective view showing a state wherein a wafer subjected to the intersection deteriorated layer forming step and the internal deteriorated layer forming step has been put on a support tape affixed to an annular frame in the wafer dividing method of the present invention.

After the above intersection deteriorated layer forming step and the internal deteriorated layer forming step are carried out along all the first dividing lines 21 and all the second dividing lines 22 formed on the semiconductor wafer 2 as described above, a tape affixing step for putting one side of the wafer on the surface of an extensible support tape affixed to an annular frame is carried out. That is, as shown in FIG. 8, the back surface 2b of the semiconductor wafer 2 is put on the surface of the extensible support tape 5 whose peripheral portion is affixed to the annular frame 4 so as to cover its inner opening portion (therefore, the front surface 2a of the semiconductor wafer 2 faces up). The above support tape 5 is prepared by applying acrylic resin-based adhesive to the surface of a 70 μm-thick sheet backing made of polyvinyl chloride (PVC) to a thickness of about 5 μm in the above illustrated embodiment. This tape affixing step may be carried out before the above intersection deteriorated layer forming step and the internal deteriorated layer forming step. In the above case, the front surface 2a of the semiconductor wafer 2 is put on the support tape 5 with the back surface 2b facing up and then, the above intersection deteriorated layer forming step and the internal deteriorated layer forming step are carried out in a state where the semiconductor wafer 2 is held on the annular frame 4.

Figure 9:
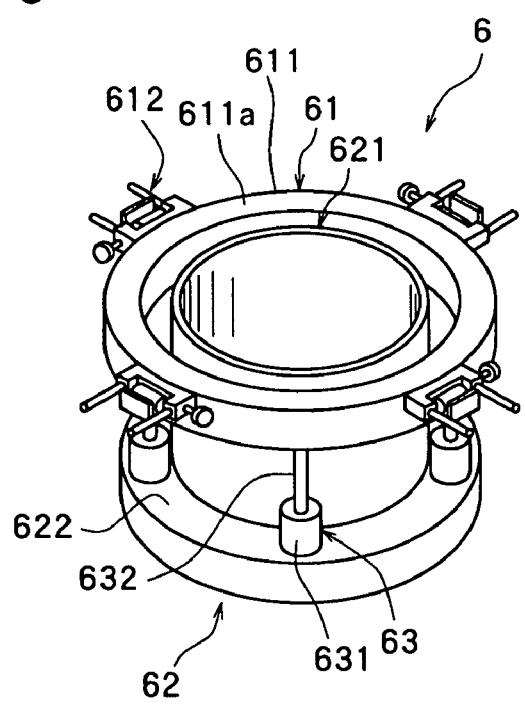
FIG. 9 is a perspective view showing an embodiment of a dividing apparatus for carrying out the dividing step in the wafer dividing method of the present invention.

After the above intersection deteriorated layer forming step, internal deteriorated layer forming step and tape affixing step, there comes a dividing step of dividing the semiconductor wafer 2 along the first dividing lines 21 and the second dividing lines 22 by exerting external force to the semiconductor wafer 2. In the illustrated embodiment, this dividing step is carried out by using a dividing apparatus 6 shown in FIG. 9. The dividing apparatus 6 shown in FIG. 9 comprises a frame holding means 61 for holding the above annular frame 4 and a tape expanding means 62 for expanding the support tape 5 affixed to the annular frame 4 held on the frame holding means 61. The frame holding means 61 has an annular frame holding member 611 and a plurality of clamps 612 as fixing means arranged on the outer periphery of the frame holding member 611. The top face of the frame holding member 611 serves as a placing surface 611a for placing the annular frame 4, and the annular frame 4 is placed on this placing surface 611a. The annular frame 4 placed on the placing surface 611a is fixed to the frame holding member 611 by the clamps 612. The frame holding means 61 thus constituted is supported by the tape expanding means 62 in such a manner that it can move in the vertical direction.

The tape expanding means 62 has an expansion drum 621 arranged on the inside of the above annular frame holding member 611. This expansion drum 621 has a smaller inner diameter than the inner diameter of the annular frame 4 and a larger outer diameter than the outer diameter of the semiconductor wafer 2 put on the support tape 5 affixed to the annular frame 4. The expansion drum 621 has a support flange 622 at the lower end. The tape expanding means 62 in the illustrated embodiment has a support means 63 that can move the above annular frame holding member 611 in the vertical direction. This support means 63 comprises a plurality of air cylinders 631 installed on the above support flange 622, and their piston rods 632 are connected to the undersurface of the above annular frame holding member 611. The support means 63 thus comprising the plurality of air cylinders 631 moves the annular frame holding member 611 in the vertical direction between a standard position where the placing surface 611a becomes substantially flush with the upper end of the expansion drum 621 and an expansion position where the placing surface 611a is positioned below the upper end of the expansion drum 621 by a predetermined distance. Therefore, the support means 63 comprising the plurality of air cylinders 631 functions as an expanding and moving means for moving the frame holding member 611 and the expansion drum 621 relative to each other in the vertical direction.

Figure 10:
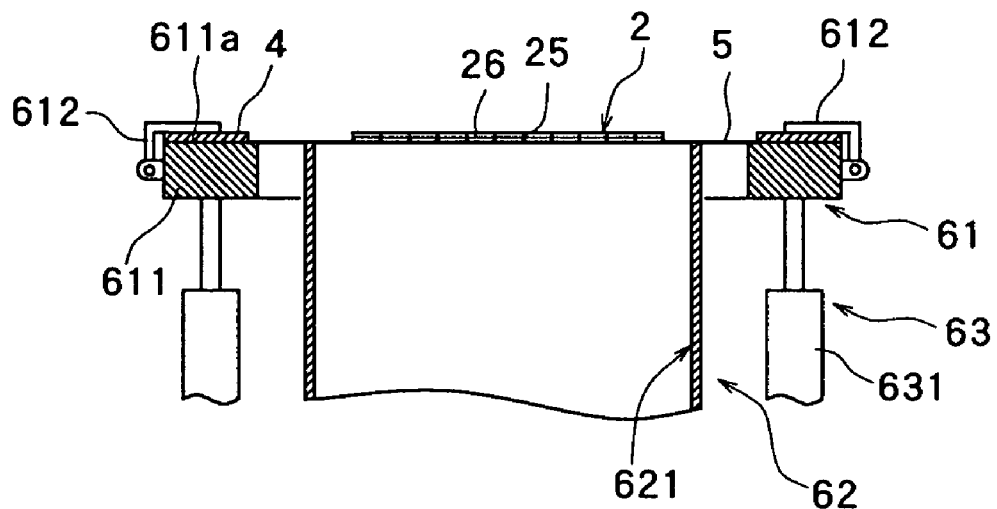
FIGS. 10(a) and 10(b) are explanatory diagrams showing the dividing step in the wafer dividing method of the present invention.
Figure 10:
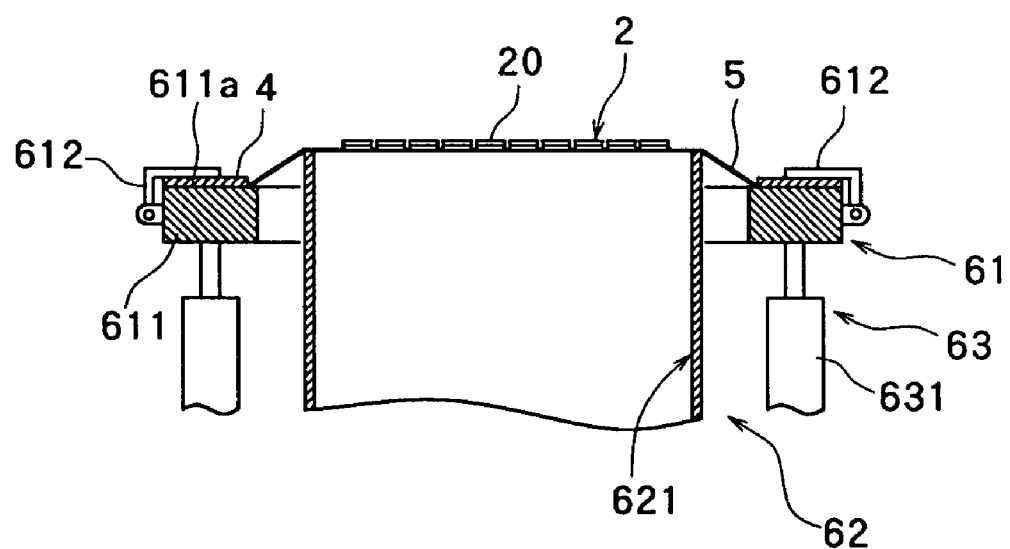

The dividing step which is carried out by using the above constituted dividing apparatus 6 will be described with reference to FIGS. 10(a) and 10(b). That is, the annular frame 4 supporting the semiconductor wafer 2 (in which the deteriorated layers 25 and 26 have been formed along the first dividing lines 21 and the second dividing lines 22) via the support tape 5 as shown in FIGS. 10(a) and 10(b) is placed on the placing surface 611a of the frame holding member 611 of the frame holding means 61 and fixed on the frame holding member 611 by the clamps 612 as shown in FIG. 10(a). At this point, the frame holding member 611 is situated at the standard position shown in FIG. 10(a). The annular frame holding member 611 is then lowered to the expansion position shown in FIG. 10(b) by activating the plurality of air cylinders 631 as the support means 63 constituting the tape expanding means 62. Therefore, as the annular frame 4 fixed on the placing surface 611a of the frame holding member 611 is also lowered, the support tape 5 affixed to the annular frame 4 comes into contact with the upper edge of the expansion drum 621 to be expanded as shown in FIG. 10(b) (tape expanding step). As a result, tensile force acts radially on the semiconductor wafer 2 affixed to the support tape 5. When tensile force acts radially on the semiconductor wafer 2, the semiconductor wafer 2 is broken along the deteriorated layers 25 and 26 to be divided into individual semiconductor chips 20 because the strengths of the deteriorated layers 25 and 26 formed along the first dividing lines 21 and the second dividing lines 22 have been reduced. At this moment, since the deteriorated layers 25 formed in the intersection areas between the first dividing lines 21 and the second dividing lines 22 are formed in a crisscross shape and in a relative large thickness, they are first broken in the interaction areas, and this breakage works as a starting point and spreads over the deteriorated layers 26 formed in the inside of the wafer, thereby making it possible to easily break the semiconductor wafer 2 along the first dividing lines 21 and the second dividing lines 22. The quantum of expansion or elongation of the support tape 5 in the above tape expanding step can be adjusted by the quantum of downward movement of the frame holding member 611. According to experiments conducted by the inventors of the present invention, when the support tape 5 was stretched about 20 mm, the semiconductor wafer 2 could be divided along the deteriorated layers 25 and 26.

The following dividing methods may be employed besides the above dividing method.

That is, a method in which the semiconductor wafer 2 (the deteriorated layers 25 and 26 have been formed along the dividing lines 21 and 22) put on the support tape 5 is placed on an elastic rubber sheet, and the top surface of the semiconductor wafer 2 is pushed down with a roller to divide the semiconductor wafer 2 along the dividing lines 21 and 22 whose strengths have been reduced by the formation of the deteriorated layers 25 and 26 may be employed. Alternatively, a method in which an ultrasonic wave composed of a longitudinal wave (compressional wave) having a frequency of about 28 kHz is applied along the dividing lines 21 and 22 whose strengths have been reduced by the formation of the deteriorated layers 25 and 26, a method in which a pressing member is applied along the dividing lines 21 and 22 whose strengths have been reduced by the formation of the deteriorated layers 25 and 26, or a method in which a heat shock is given by applying a laser beam along the dividing lines 21 and 22 whose strengths have been reduced by the formation of the deteriorated layers 25 and 26 may be employed.

Figure 11:
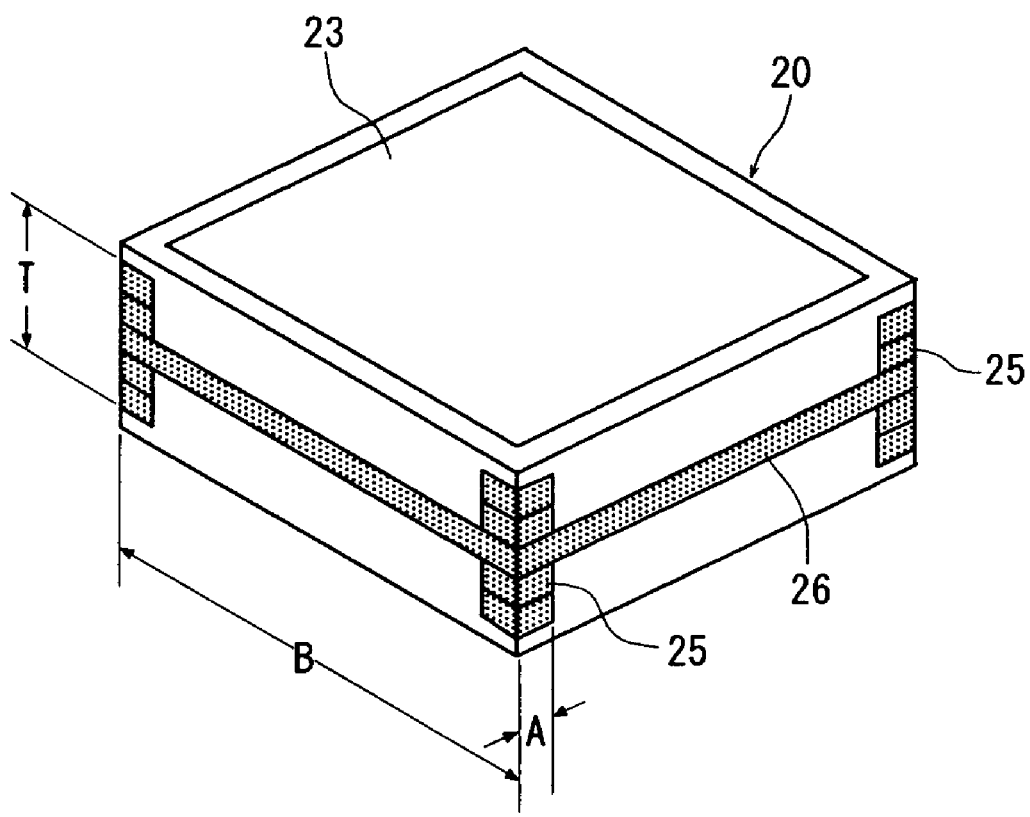
FIG. 11 is a perspective view of a chip obtained by the wafer dividing method of the present invention.

The semiconductor chip 20 individually divided as described above has the deteriorated layers 25 and 26 remaining on its side faces as shown in FIG. 11. However, the deteriorated layers 25 exist only in the both end portions in the longitudinal direction of the side faces, and the deteriorated layers 26 are formed in the inside of the semiconductor chip and do not reach the front surface and the back surface. Therefore, the transverse rupture strength of the semiconductor wafer 2 does not degrade. As the thickness and length A of the above deteriorated layer 25 increase, dividing in the dividing step becomes easier but they exert an influence upon the reduction of the transverse rupture strength. To facilitate dividing without reducing the transverse rupture strength of the semiconductor chip 20, the total thickness T of the deteriorated layers 25 and 26 is desirably 60% or more of the thickness of the semiconductor chip 20 and the length A of each of the deteriorated layers 25 is desirably 5 to 15% of the length of one side of the semiconductor chip 20.

What is claimed is:

1. A method of dividing a wafer having function elements formed in areas sectioned by a plurality of first dividing lines formed parallel to one another and a plurality of second dividing lines that intersect with the first dividing lines and are formed parallel to one another, on the front surface thereof, along the first dividing lines and the second dividing lines, comprising:

an internal deteriorated layer forming step for forming internal deteriorated layers in the inside of the wafer along the first dividing lines and the second dividing lines by applying a pulse laser beam capable of passing through the wafer along the first dividing lines and the second dividing lines;

an intersection deteriorated layer forming step for forming intersection deteriorated layers that are thicker than the internal deteriorated layers by applying a pulse laser beam capable of passing through the wafer to intersection areas formed between the first dividing lines and the second dividing lines, wherein the intersectional deteriorated layers are formed inside the wafer, between the front and back surfaces thereof, wherein the intersection deteriorated layers are formed above and below the internal deteriorated layers to thereby form a cross shape therewith, a dividing step for dividing the wafer into individual chips along the first dividing lines and the second dividing lines by exerting external force along the first dividing lines and the second dividing lines of the wafer having the internal and intersectional deteriorated layers, wherein the total thickness of the intersection deteriorated layers is set to 60% or more of the thickness of the wafer, and wherein the length of the intersection deteriorated layers is set to 10 to 30% of the interval of the first dividing lines and the interval of the second dividing lines.

2. The method of dividing a wafer according to claim 1, wherein the dividing step is to divide the wafer into individual chips along the first dividing lines and the second dividing lines by expanding an extensible support tape affixed to the wafer which has been subjected to the internal deteriorated layer forming step and the intersection deteriorated layer forming step.

* * * * *